(12) United States Patent
Bjoerk et al.

(10) Patent No.: US 8,193,524 B2
(45) Date of Patent: Jun. 5, 2012

(54) NANOELECTRONIC DEVICE

(75) Inventors: Mikael T Bjoerk, Affoltern am Albis (CH); Joachim Knoch, Obfelden (CH); Heike E Riel, Baech (CH); Walter Heinrich Riess, Thalwil (CH); Heinz Schmid, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 438 days.

(21) Appl. No.: 12/564,091

(22) Filed: Sep. 22, 2009

(65) Prior Publication Data
US 2010/0072460 A1 Mar. 25, 2010

(30) Foreign Application Priority Data
Sep. 24, 2008 (EP) .................................. 08105425

(51) Int. Cl.
| H01L 29/06 | (2006.01) |
| H01L 31/0328 | (2006.01) |
| H01L 31/0336 | (2006.01) |
| H01L 31/072 | (2012.01) |
| H01L 31/109 | (2006.01) |
| H01L 23/48 | (2006.01) |
| H01L 23/52 | (2006.01) |
| H01L 29/40 | (2006.01) |
| H01L 21/20 | (2006.01) |

(52) U.S. Cl. .................... 257/24; 257/773; 257/E29.07; 257/E29.245; 257/E21.404; 438/584; 977/762

(58) Field of Classification Search ................... 257/24, 257/773, E29.07, E29.245, E21.404; 438/584; 977/762
See application file for complete search history.

(56) References Cited

U.S. PATENT DOCUMENTS
7,186,380 B2  3/2007 Chen et al.
2005/0093025 A1* 5/2005 Chen et al. .................... 257/211

FOREIGN PATENT DOCUMENTS
JP  2006-093390  4/2006
KR  2005-0024458  3/2005

OTHER PUBLICATIONS
Y.M. Niquet, et al., "Electronic Structure of Semiconductor Nanowires", Physical Review B73, 165315, (2006).

* cited by examiner

*Primary Examiner* — David S Blum
(74) *Attorney, Agent, or Firm* — Vazken Alexanian

(57) ABSTRACT

An electronic device and method of manufacturing the device. The device includes a semiconducting region, which can be a nanowire, a first contact electrically coupled to the semiconducting region, and at least one second contact capacitively coupled to the semiconducting region. At least a portion of the semiconducting region between the first contact and the second contact is covered with a dipole layer. The dipole layer can act as a local gate on the semiconducting region to enhance the electric properties of the device.

18 Claims, 7 Drawing Sheets

NANOELECTRONIC DEVICE

CROSS REFERENCE TO RELATED APPLICATION

This application claims priority under 35 U.S.C. 119 from European Patent Application 08105425.6, filed Sep. 24, 2008, the entire contents of which are incorporated herein by reference.

BACKGROUND OF THE INVENTION

1. Field of the Invention

The present invention relates to an electronic device, particularly to an enhanced nanowire electronic device having a plurality of contacts. The present invention further relates to a method for manufacturing the electronic device.

2. Description of Related Art

One of the basic electronic components in modern electric devices, such as memories, logic devices and microprocessors is the transistor. Currently, complementary metal-oxide-semiconductor (CMOS) technology employs doped semiconductor material to form source and drain contacts in field-effect transistors in addition to a semiconductor channel. Conventional CMOS technology will soon reach fundamental physical limits preventing further scaling. In order to extend device miniaturization, semiconducting nanowires about 2 to 100 nm in diameter are a high-potential option for implementing the channels of field-effect transistors.

The downscaling of conventional MOSFET devices raises certain issues related to the doping of the semiconductor regions for realizing source or drain contacts. For example, dopants usually are inserted into the semiconductor by ion implantation and subsequent activation using annealing at elevated temperatures. During the annealing process dopants might diffuse into regions where no doping is intended. With decreasing dimensions, high doping levels are necessary in order to create sufficiently low resistive semiconductor regions for source and/or drain contacts. Desired doping levels are as high as possible but typically limited to below $10^{21}/cm^3$ which roughly translates to about 1 doping atom per hundred semiconductor atoms. Hence, with decreasing device dimensions the contacts give rise to an undesired variability with respect to parasitic resistances and contact resistances.

Additionally, in order to suppress short channel effects, doped semiconductor source and drain regions have to be very shallow. In order to implement well-defined channels and contact regions the doping profiles need to be very abrupt and precise. Due to the required high temperature activation, however, it is difficult to realise such precise and abrupt doping profiles because of a diffusion of the implanted doping atoms smearing out the resulting doping profile.

Although FinFETs and nanowire FETs offer better scalability, the issues discussed above still remain. FIG. 1 shows a detail of a conventional nanowire field-effect transistor device, an illustration of ion implantation and a corresponding dopant profile. In FIG. 1B, for example, a nanowire NW is in contact with the source contact S and surrounded by a gate contact G which is separated from the wire by a dielectric DE. In particular, the section of the nanowire NW between source S and gate G gives rise to bad contacts and parasitic resistances.

FIG. 1A shows schematically a process of ion implantation II indicated by solid arrows on a nanowire NW. The nanowire NW is shown in a cross-sectional view. Since nanowires typically have very small diameters between 2 and 100 nm, most of the dopant ions are scattered out of the nanowire NW which is illustrated in FIG. 1A by the dashed lines. As a result, as shown in the lower portion of FIG. 1B the doping concentration DC along the wire axis X is very low between source S and gate G, resulting in higher parasitic resistance of the section of the nanowire NW between source S and gate G.

The region between the gated area of the nanowire NW and the source S (or drain D) contacts are also referred to as the gate underlap. Hence, conventional ion implantation techniques in nanowire field-effect transistors are rather inefficient. Further, recrystallization in semiconductor nanowires is almost impossible because there is not enough crystalline bulk material to re-crystallize from.

SUMMARY OF THE INVENTION

In accordance with one aspect of the present invention, an electronic device is provided that includes: a semiconducting region; a first contact electrically coupled to the semiconducting region; and at least one second contact capacitively coupled to the semiconducting region; wherein at least a portion of the semiconducting region between the first contact and the second contact is covered with a dipole layer.

In accordance with another aspect of the present invention, at least two electronic devices as described above are provided, wherein said devices have common first contacts or common second contacts.

In accordance with still another aspect of the present invention, a method for manufacturing an electronic device includes the steps of: providing a semiconducting region; providing a first electric contact to the semiconducting region for forming a first terminal; providing a second capacitive contact to the semiconducting region for forming a second terminal; and forming a dipole layer on the semiconducting region at least partially between the first and second contacts.

An advantage of the device is that the dipole layer may act as a local self-aligning gate on the intrinsic semiconducting material of the semiconducting region. Hence, no additional gates need to be patterned with extreme precision on a nanoscale. Further, no additional wiring, for example, for applying a complementary local gate voltage is required.

BRIEF DESCRIPTION OF THE DRAWINGS

In the figures, where alike or functionally alike elements have been assigned the same reference symbols.

DETAILED DESCRIPTION OF PREFERRED EMBODIMENTS

Figure 1A:
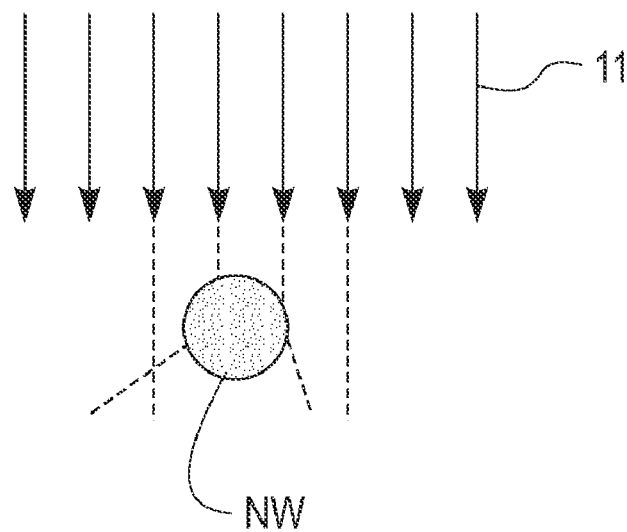
FIG. 1 shows a conventional nanowire transistor.
Figure 1B:
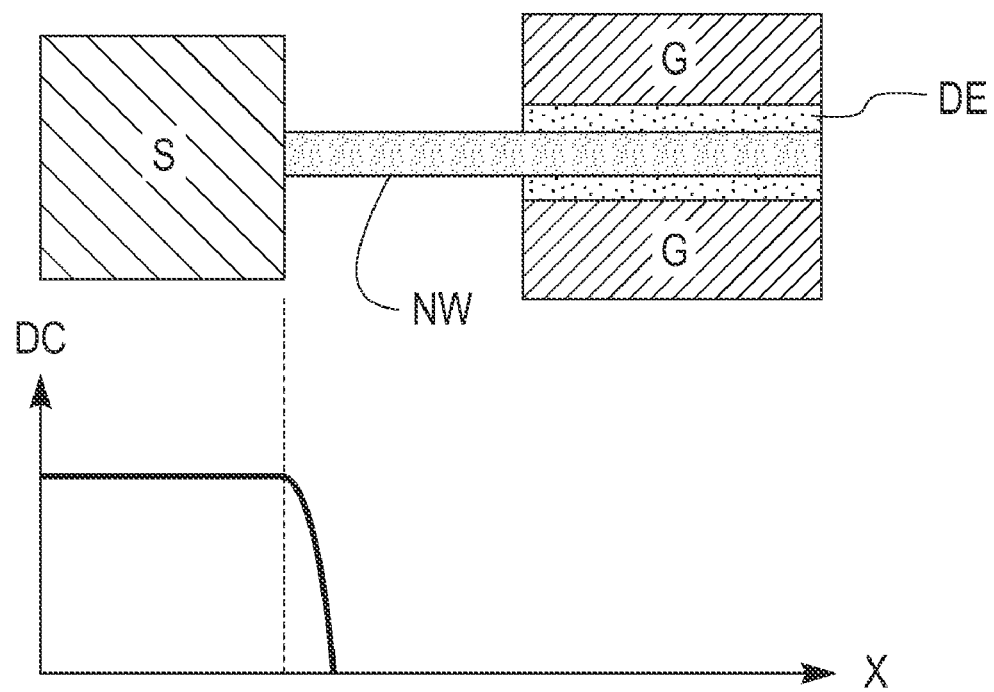

In an embodiment of the present invention, a device includes a semiconducting region. A first contact is coupled to the semiconducting region and at least one second contact is capacitively coupled to the semiconducting region. Between the first contact and the second contact at least a portion of the semiconducting region is covered with a dipole layer.

The dipole layer can be considered a local additional gate wherein a dipole moment at the interface between the semiconducting region and the dipole layer induces a conducting channel in the semiconducting region. This is particularly true when, for example, according to an aspect of the present invention, the semiconducting region is a semiconductor nanowire including an intrinsic semiconductor material. An advantage of the device is that the dipole layer may act as a local self-aligning gate on the intrinsic semiconducting material of the semiconducting region. Hence, no additional gates need to be patterned with extreme precision on a nanoscale. Further, no additional wiring, for example, for applying a complementary local gate voltage is required. One can consider the conducting channel induced by the dipole moments; or the electric field of the dipole layer, close to the semiconducting region as a doped semiconductor portion. Hence, the dipole layer implements an electrostatic doping.

The dipole layer does not need to be in direct contact with the semiconducting material. Rather, intermediate layers in between the dipole layer and, for example, a nanowire can be provided without affecting the influence of the dipole field upon the semiconductor nanowire. Therefore, "being covered with a dipole layer" means that an electric field due to the dipole moment of the layer may affect the band structure of the semiconducting region. "Being covered" or "covering" with a dipole layer is to be construed as placing the dipole layer sufficiently close to the semiconducting region or to a nanowire to allow for an electrostatic interaction between the semiconducting material and the dipole layer material.

For example, the dipole layer may contain an alkali-halide having a reasonable dipole moment. In particular, the dipole layer may contain a material of the group of LiF, NaCl, KCl, $BaF_2$, $CaF_2$, $V_2O_5$, CaO, and MgO. Other materials having a dipole moment that can be deposited onto the nanowire can be used. The dipole layer can be insulating. However, an electrically conducting dipole layer material can be contemplated. In particular, if intermediate insulating layers are provided in direct contact with the semiconducting region the dipole electric field inducing layer can include a conducting material. There exist also suitable organic materials developing a dipole layer at an interface with, for example, the semiconducting region.

The device can be implemented to have a source or drain contact as the first contact and a gate contact as the second contact. A third contact can be electrically coupled to the semiconducting region wherein the second contact is placed between the first and third contacts. A configuration according to this aspect results in a field-effect transistor device wherein the semiconducting region realizes the channel which is controlled by an appropriate gate potential coupled to the gate contact.

According to another aspect, coaxial gate-dielectric channel geometry can be realized by wrapping the second contact around the semiconducting nanowire. This configuration can also be called wrapped-gate architecture. Such architecture can be implemented in a vertical or lateral configuration. The coaxial gate-dielectric channel allows for better gate control and thus yields in improved switching properties of such a field-effect transistor.

According to yet another aspect of the electric device, the dipole layer covers the first contact of the semiconductor nanowire and potentially the second contact. If the dipole layer is insulating, it can be deposited as a last production step over the entire structure without any additional masking arrangements.

The desired local gating effect on the semiconducting region can be achieved without any undesired parasitic resistance or capacitance. It is a further advantage of the deposited dipole layer acting as self-aligned gate that any parasitic capacitances between source or drain and gate are reduced. Therefore, embodiments of the device have an improved frequency response and reduced power consumption with respect to conventional nanowire transistors, for example.

A nanowire as the semiconducting region can be manufactured by a variety of processes. As an example, semiconducting nanotubes are mentioned below. Depending on the actual geometry of wrapped carbon sheets forming a nanotube, the electric properties can be metallic, insulating or semiconducting. Hence, a nanotube can serve as a nanowire in certain embodiments of the present invention. Further, nanowires can be produced by lithography on a semiconductor substrate or other conventional methods. The cross-sectional geometry of the nanowire, in principle, is irrelevant. Therefore, one can fabricate nanowires having regular cross-section as well as wires having irregular geometries. Further, a corresponding semiconductor nanowire can be engineered to be an n-type or a p-type semiconductor.

The present invention can be embodied as a transistor arrangement including a plurality of devices as described above. In particular, the formed devices may have common first contacts or common second contacts. For example, multi-gate devices like FinFETs or Trigate transistors might be used. In a FinFET, a conducting channel is wrapped around a thin silicon fin which forms the body of the device.

Figure 2:
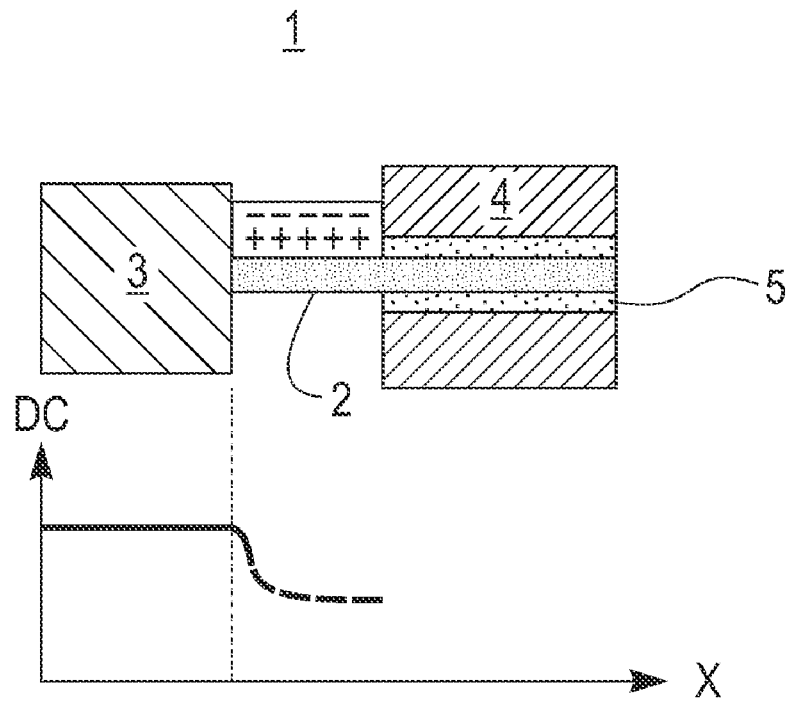
FIG. 2 shows an illustrative diagram of a first embodiment of a device according to the present invention.

Referring to FIG. 2, an illustrative diagram of a first embodiment of a nanoelectronic device is shown. The device 1 includes a nanowire 2, a first (source) contact 3 and a second (gate) contact 4. The source contact 3 is in electrical contact with the nanowire 2, and the gate contact 4 is capacitively coupled to the nanowire 2 through an insulating layer 5 that surrounds the nanowire NW. The nanowire 2 includes intrinsic semiconductor material. Hence, when applying a gate voltage to the gate electrode 4 a current flow from the source electrode 3 to a (not shown) second electrode can be controlled in the semiconducting nanowire channel. In other embodiments the nanowire material can include slightly doped material. Also radial or axial heterostructures can be involved.

The portion of the nanowire between the source electrode 3 and the gate electrode 4 is referred to as the underlap region. In FIG. 2, a dipole layer 6 made of an insulating dielectric material is deposited on the underlap region on the nanowire 2. A material of the dielectric insulating layer 6 is chosen as to act with its dipole moment onto the nanowire 2. Thereby, the dipole electric field interacting with the intrinsic semiconductor region of the nanowire 2 creates an inversion layer similar to a dedicated gate placed close to the underlap region. However, the dipole layer, as for example, LiF or MgO, can be considered a local gate that is self-aligned. Due to the self-aligned local gating by such a dipole layer the resistance of the underlap region is reduced. This can be seen from the lower portion of FIG. 2 where a corresponding dopant concentration DC is shown along the wire axis X. One can see that the dipole moment induces an inversion or accumulation layer in the intrinsic region of the nanowire 2. As a consequence, any parasitic resistance is extremely low. Further, potential parasitic capacitance between the source 3 and the gate 4 is also reduced due to the dielectric.

Figure 3:
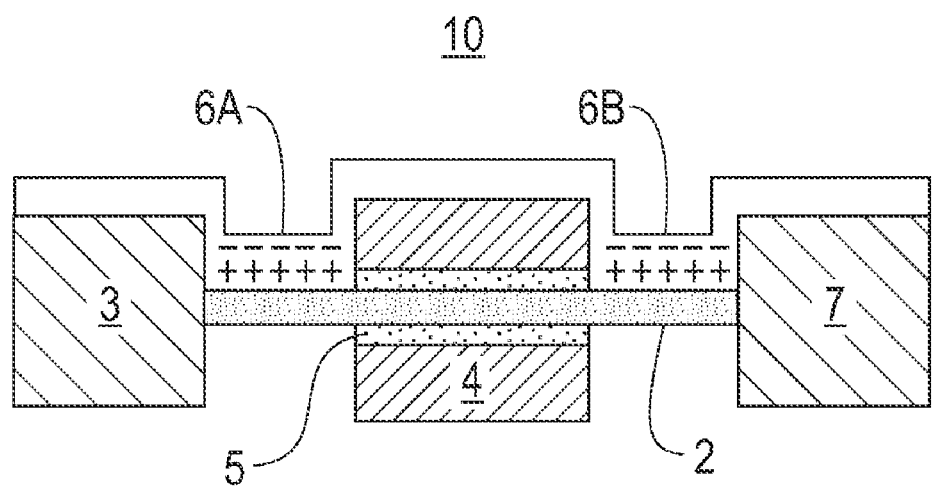
FIG. 3 shows an illustrative diagram of a nanowire transistor as a second embodiment of a device according to the present invention.

FIG. 3 is an illustrative diagram of a nanowire field-effect transistor employing the same concept as shown in FIG. 2. The nanowire transistor 10 includes a semiconducting nanowire 2, a source contact 3 and a drain contact 7. Between the source contact 3 and the drain contact 7 a gate contact 4 is capacitively coupled to the nanowire 2. For example, gate 4 can be provided coaxially with the wire axis wherein a gate material 4 is separated from the wire by a dielectric 5. For reducing any undesired electrical effects due to the low actual doping of the nanowire 2 in the underlap region the entire transistor architecture is deposited with the dielectric insulating layer 6. In particular, the dielectric dipole material is close to the underlap regions between the source and gate contact 3, 4 and between the drain and gate contacts 7, 4. Consequently, the wire regions conventionally posing a high parasitic resistance are locally gated by a dielectric layer 6A, 6B.

As already shown with respect to FIG. 2, the effective doping concentration in the underlap regions is increased with respect to the bare nanowire. In particular, a local gating effect due to an attached dipole layer can be achieved by depositing an alkali-halide layer to a Hall-bar structure. While at a certain temperature conventionally no current flows through the Hall-bar structure the same structure with an attached LiF region becomes conductive. By realizing a dielectric dipole layer interface with the Hall-bar a conducting channel is formed through the gating effect.

Hence, the gating by the dielectric insulating layer on a nanowire indeed induces a conductive channel with a significantly higher carrier density than has the bare nanowire. Referring to the field-effect transistor arrangement 10 of FIG. 3, the dielectric layer regions 6A and 6B which are attached to the nanowire 2 in the underlap provide for a local gating effect. Local gating also induces an effective doping concentration if an additional insulating layer between the nanowire 2 and the dielectric 6 is provided. Even a thin silicon oxide layer does not significantly affect interaction of the dielectric electric field created by the dielectric layer 6 with a semiconductor band structure.

FIG. 4 shows various process steps of a method for producing a nanowire transistor. In FIG. 4A, first, a substrate 8 is provided on which a nanowire 2A, 2B is manufactured. For example, nanowires can be lithographically etched or by other means be created on a substrate. Another example for a quantum wire is a carbon nanotube 2B consisting of wrapped-up graphite sheets which can result in a semiconducting electronic structure which is metallic, insulating, or a semiconductor. By engineering the wrap-up process, for example, by certain catalysts in the creation process nanotubes can be engineered to be semiconducting and therefore pose examples of nanowires. Typical dimensions of either semiconductor or molecular nanowires 2A, 2B range between 1 and 100 nm in diameter. Molecular nanowires, such as carbon nanotubes can have even smaller dimensions. The longitudinal extension can be a couple of 100 nm. In the perspective view of FIG. 4A the geometry of nanowires 2A, 2B only serve as illustrative models.

Figure 4A:
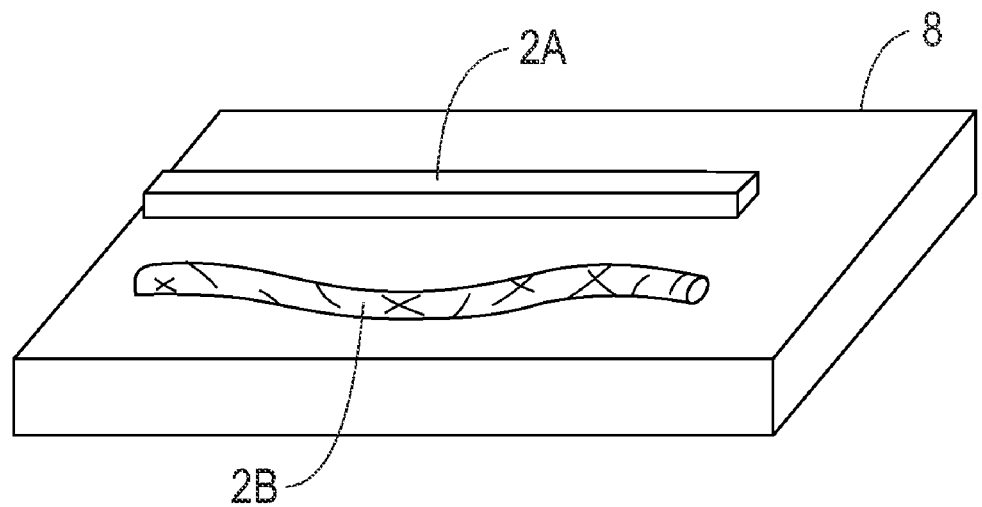
FIG. 4 shows various process steps of a method for producing an embodiment of a nanowire transistor.
Figure 4B:
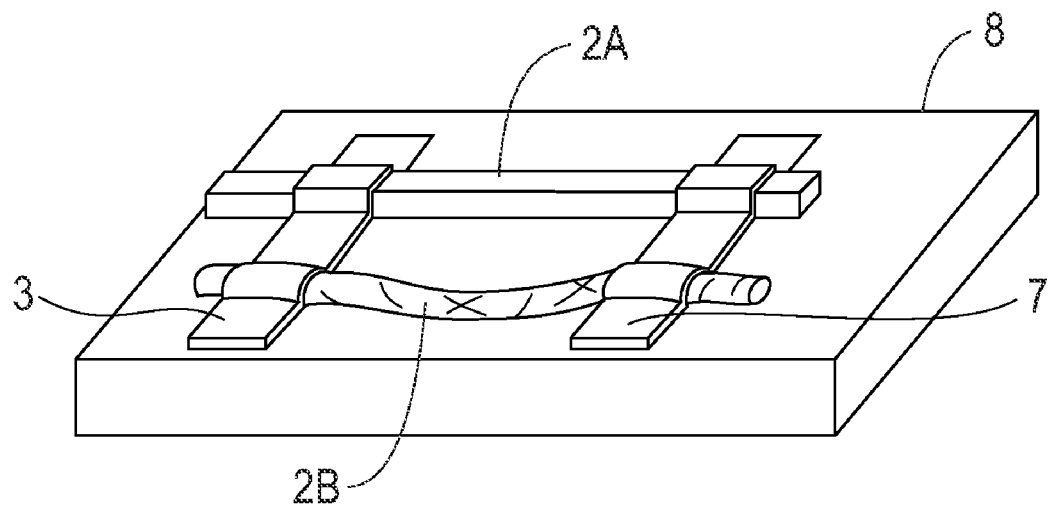

In FIG. 4B, the respective nanowire 2A, 2B is provided with a source electrode 3 and with a drain electrode 7. For example, metal can be deposited onto the nanowires 2A, 2B. Source and drains 3, 7 are electrically coupled to the semiconducting nanowires 2A, 2B. Source or drain contacts can also be implemented by strongly doped n- or p-type semiconductors.

Figure 4C:
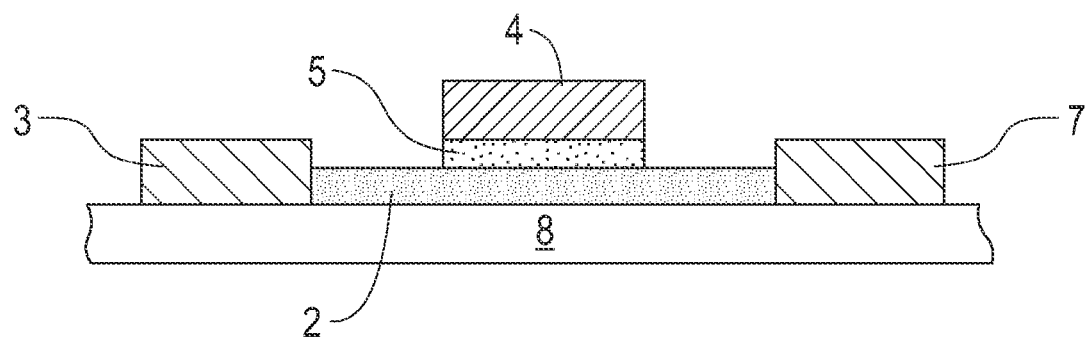

FIG. 4C shows a crossectional view of the substrate 8, source and drain contacts 3, 7 where in-between the nanowire 2 is placed. Further, a dielectric layer 5 is locally applied to the nanowire 2 to separate a gate contact 4 electrically from the nanowire material. Hence, the nanowire field-effect transistor is realized wherein the semiconducting nanowire 2 provides for a field-effected channel, which is controlled by applying a gate voltage to the gate contact 4.

Figure 4D:
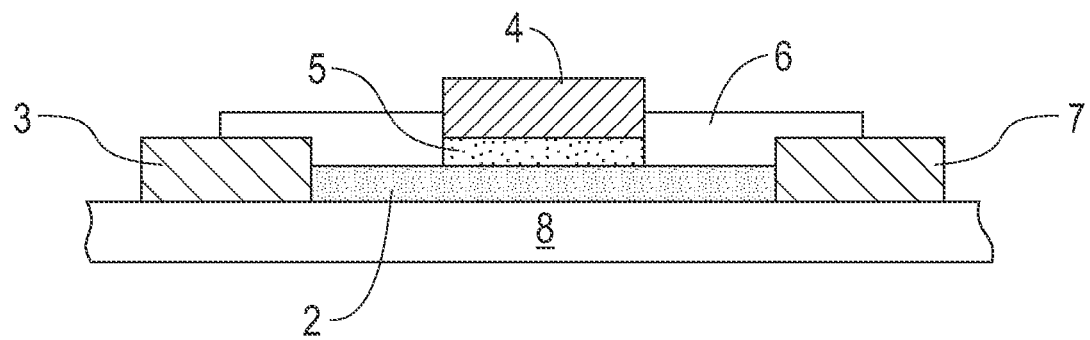

FIG. 4D shows an eventual process step in which the underlap regions of the nanowire 2 between source and gate 3, 4 and between gate and drain 4, 7 are coupled with an insulating dielectric layer 6. The insulating dielectric 6 has a dipole moment that interacts with the nanowire 2. As examples, LiF, NaCl, KCl, $BaF_2$, $CaF_2$, $V_2O_5$, CaO, and MgO are potential dielectric materials which can be deposited on the nanowire 2. Consequently, a device illustrated in FIG. 3 is formed.

Figure 5A:
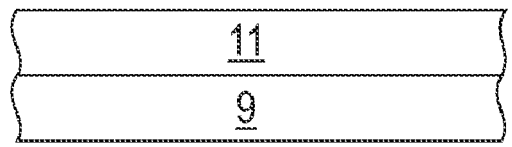
FIG. 5 shows various process steps of a method for producing another embodiment of a nanowire transistor.
Figure 5B:
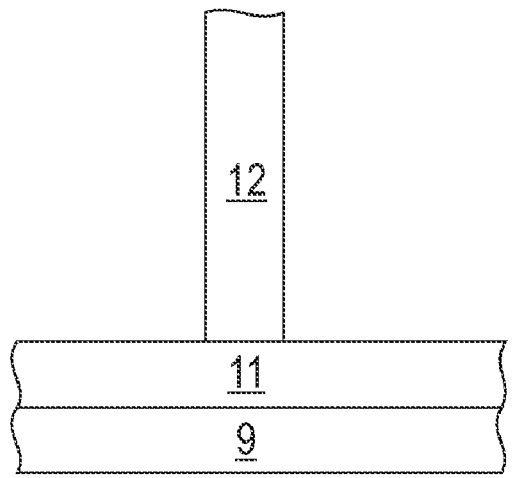

In a variant of a manufacturing process for a nanowire transistor the nanowire can be grown vertically on a substrate. For example, FIG. 5 shows various process steps of producing another embodiment of a nanowire transistor. In FIG. 5A first, for example, a semiconductor substrate 11 is provided. Then, a metal layer 9, for example aluminium, is deposited onto the backside of the semiconductor substrate 11. An n-doped silicon layer 11 can be patterned with catalysts that lead to vertical nanowire growth. FIG. 5B shows a portion of a nanowire 12 grown on top of a silicon layer 11. The nanowire 12 can be intrinsic semiconductor material such as silicon.

Figure 5C:
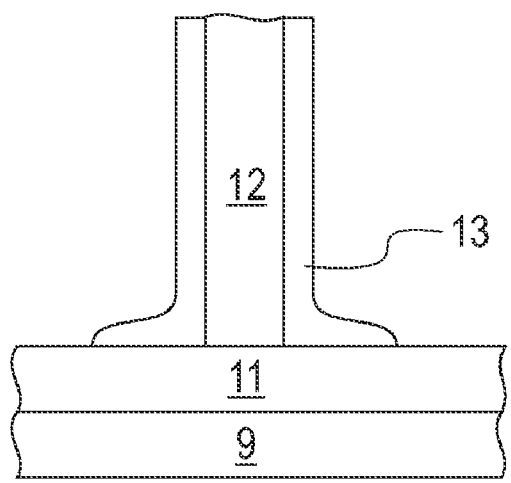

Next, in the process step illustrated in FIG. 5C a silicon oxide layer 13 is deposited onto the nanowire 12 and the silicon layer 11. Silicon oxide 13 surrounding the nanowire 12 provides for an insulating separation for a gate material to be deposited as well. Other dielectric materials are feasible. In principle, the shape of the oxide layer 13 can be adapted to the needs of further process steps.

Figure 5D:
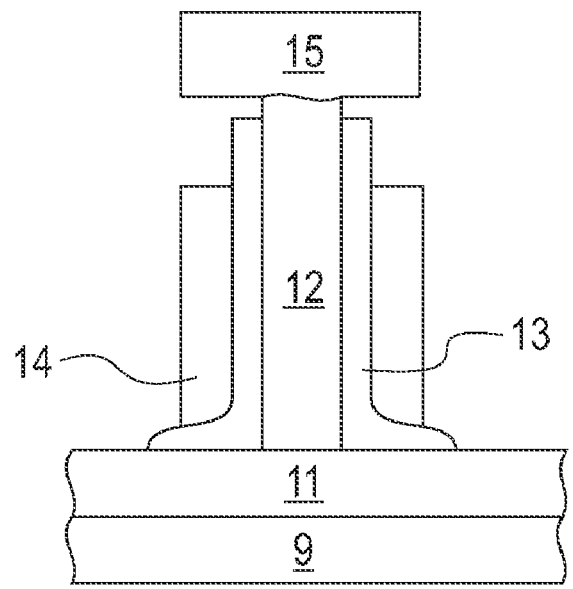

In following process steps one deposits a metallic gate electrode 14, for example, aluminium, and an upper for example drain contact 15 made of metal. This is shown in FIG. 5D. The gate 14 surrounds the nanowire 12 coaxially, as shown in a cross-sectional view. As explained before, the underlap region, i.e. the region in FIG. 5D of the wire which is not surrounded by the gate 14 may exhibit an undesired high resistance. Hence, to provide for a local gating of this underlap region an insulating dielectric layer 6 is placed around the structure of the nanowire 12.

Figure 5E:
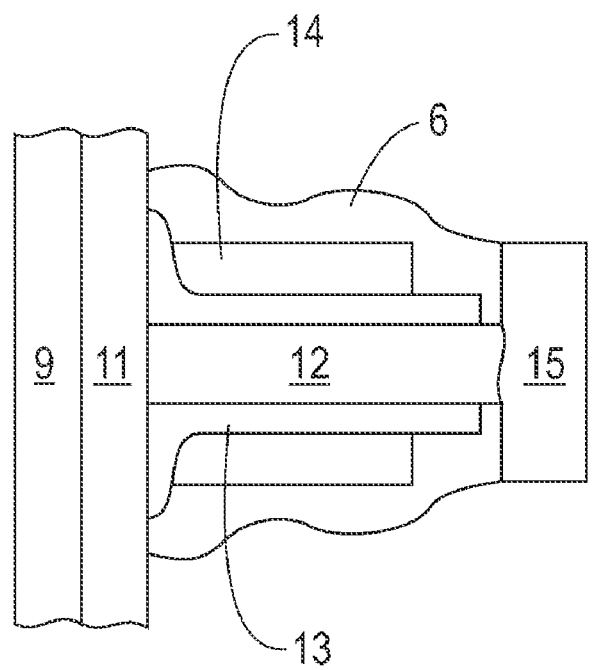

FIG. 5E shows a rotated view with respect to FIG. 5D wherein from left to right a source contact 9, 11, the nanowire channel 12 and the drain contact 15 is shown. In an implementation shown in FIG. 5E insulating dielectric layer 6, for example a LiF, is deposited on silicon oxide layer 13. Although a local gating effect may be diminished by layer 13, still depending on the actual dipole moment of the dipole layer 6 the bandstructure of the nanowire 12 is affected in the underlap regions. As a consequence, the electric properties of the nanowire field-effect transistor are enhanced. Additionally, layer 13 can be used as a diffusion barrier against alkali atoms from the dipole layer and therefore avoid intermixing of material from the dipole layer with the semiconductor.

Depending whether a p- or n-channel field-effect transistor is desired the surface polarity of the orientation of the dipole layer 6 can be adjusted. For example, intermediate layers between the dipole layer 6 and the nanowire 2 can be inserted to control the orientation of the dipole field.

Figure 6:
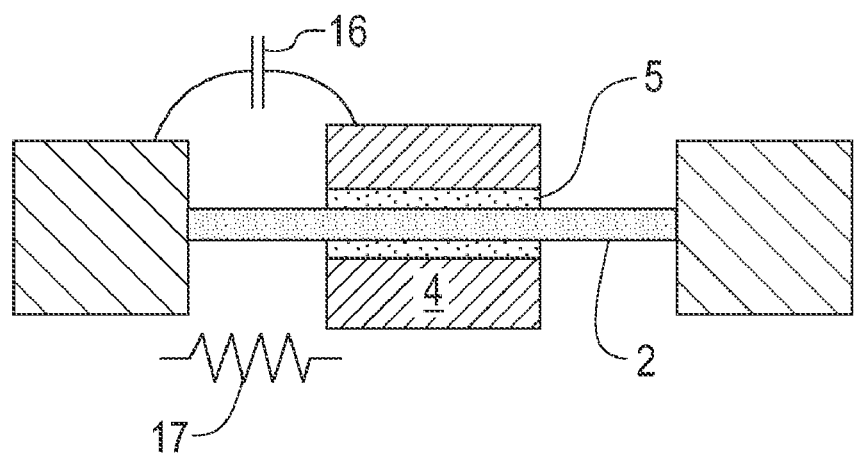
FIG. 6 shows an illustrative diagram of a nanowire transistor for illustrating parasitic capacitances and resistances.

FIG. 6 shows an illustrative diagram of a nanowire transistor and potentially occurring parasitic capacitances and resistances. In principle, a nanowire transistor is formed as a nanowire 2 between source and drain contacts 3, 7. Further, the gate 4 is placed between those contacts 3, 7 and electrically separated from the nanowire 2 by an insulating layer 5.

For illustrative reasons a parasitic capacitance 16 between the source contact 3 and gate contact 4 is shown and a parasitic resistance 17 between the source contact 3 and the gate contact 4 is illustrated.

In particular, providing a dielectric layer between this underlap region between the source or the drain and the gate contact results first in an increased conductive property of the nanowire in this region; i.e., as a result of the local self-aligned gate the resistance is reduced due to the effective doping concentration in the wire 2 which is increased.

Since the insulating dielectric, for example LiF-layer, does not affect source, gate and drain contacts, it can be deposited for example via thermal evaporation on top of the entire structure at the end of the production process. Because alkali-halides as dipole layers are insulators no further processing is required. Providing an insulating dipole layer can also be implemented in manufacturing processes for multi gate structures.

Figure 7:
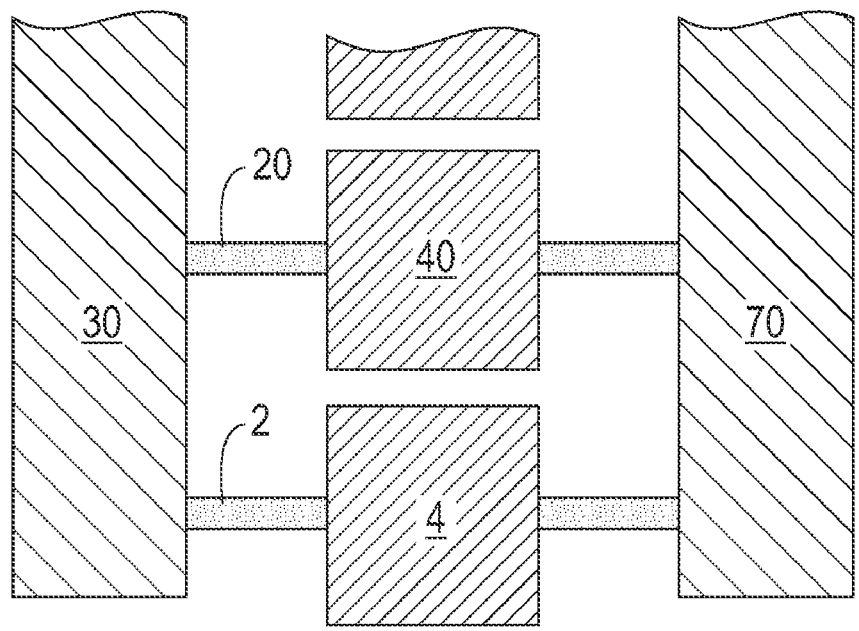
FIG. 7 shows an illustrative diagram of an embodiment of nanowire transistor arrangement.

FIG. 7 shows a nanowire transistor arrangement in a top view. The arrangement 100 includes a plurality of nanowires 2, 20 which have common source contacts 30 and common drain contacts 70. Each nanowire 2, 20 is provided with a dedicated gate 4, 40. Although not shown in FIG. 7, now an insulating dipole layer can be deposited on top of the entire structure for providing of a local gating in the overlap regions between gates 4, 40 and source and drain 30, 70. One can also contemplate other structures such as a nanowire placed between the source and the drain and multiple gate regions in-between.

Although the present invention is disclosed with respect to certain preferred embodiment, variations having other combinations of features are also contemplated.

What is claimed is:

1. An electronic device, comprising:
    a semiconducting region;
    a first contact electrically coupled to said semiconducting region; and
    at least one second contact capacitively coupled to said semiconducting region;
    wherein at least a portion of said semiconducting region between the first contact and the second contact is covered with a dipole layer.

2. The device of claim 1 wherein said semiconducting region comprises an intrinsic semiconductor material.

3. The device of claim 2 wherein said dipole layer is chosen to provide local doping of said intrinsic semiconductor material as a function of a dipole moment of said dipole layer.

4. The device of claim 3 wherein said dipole layer comprises an alkali-halide.

5. The device of claim 4 wherein at least one intermediate layer is between said semiconducting region and said dipole layer.

6. The device of claim 5 wherein said dipole layer is an insulating dipole layer.

7. The device of claim 1 wherein said first contact is a source contact or a drain contact, and said second contact is a gate contact.

8. The device of claim 1, further comprising a third contact electrically coupled to said semiconducting region, wherein said second contact is placed between said first and said third contact.

9. The device of claim 7 wherein said dipole layer at least partially covers each of (i) said first contact, (ii) said semiconducting region between said first and second contacts, and (iii) said second contact.

10. The device of claim 1 wherein said device is a field effect transistor.

11. The device of claim 1 wherein said semiconducting region is a semiconducting nanowire.

12. The device of claim 11 wherein said second contact surrounds said semiconducting nanowire, thereby forming a coaxial gate-dielectric channel geometry.

13. The device of claim 11 wherein said semiconducting nanowire is a carbon nanotube.

14. A transistor arrangement including at least two electronic devices, each of which comprises:
    a semiconducting region;
    a first contact electrically coupled to said semiconducting region; and
    at least one second contact capacitively coupled to said semiconducting region;
    wherein at least a portion of said semiconducting region between the first contact and the second contact is covered with a dipole layer; and
    wherein at least one of said first or second contacts is common to at least two of said at least two electronic devices.

15. A method for manufacturing an electronic device, comprising:
    providing a semiconducting region;
    providing a first electric contact to said semiconducting region forming a first terminal;
    providing a second capacitive contact to said semiconducting region forming a second terminal; and
    forming a dipole layer on said semiconducting region at least partially between said first and said second contact.

16. The method of claim 15 further comprising the step of depositing at least one intermediate layer between said semiconducting region and said dipole layer.

17. The method of claim 15 wherein said electronic device is a nanowire field effect transistor.

18. The method of claim 17 wherein the step of forming said dipole layer comprises:
    depositing an insulating dielectric material on said nanowire field effect transistor.

* * * * *